United States Patent
Kondo

(10) Patent No.: US 9,773,713 B2
(45) Date of Patent: Sep. 26, 2017

(54) ELECTRONIC COMPONENT, METHOD FOR MANUFACTURING ELECTRONIC COMPONENT, ELECTRONIC APPARATUS, AND MOVING OBJECT

(71) Applicant: SEIKO EPSON CORPORATION, Tokyo (JP)

(72) Inventor: Manabu Kondo, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 118 days.

(21) Appl. No.: 14/804,552

(22) Filed: Jul. 21, 2015

(65) Prior Publication Data
US 2016/0029487 A1 Jan. 28, 2016

(30) Foreign Application Priority Data
Jul. 24, 2014 (JP) .................. 2014-150484

(51) Int. Cl.
*H01R 9/00* (2006.01)
*H01L 23/13* (2006.01)
(Continued)

(52) U.S. Cl.
CPC .......... *H01L 23/13* (2013.01); *B81C 1/00261* (2013.01); *H01L 23/49811* (2013.01); *H01L 23/15* (2013.01); *H01L 2224/48225* (2013.01); *H01L 2924/1517* (2013.01); *H01L 2924/15153* (2013.01); *H01L 2924/15311* (2013.01)

(58) Field of Classification Search
CPC ......... H05K 1/111; H05K 2201/10628; H05K 2201/09372; H05K 2201/10772; H05K 2201/09381; H05K 2201/10977; H05K 3/3426; H05K 2201/09427; H03B 5/32;
(Continued)

(56) References Cited

U.S. PATENT DOCUMENTS

| 4,697,204 A | 9/1987 | Mita et al. |
| 5,025,348 A * | 6/1991 | Suzuki ................ G02F 1/13452 |
| | | 257/E21.509 |

(Continued)

FOREIGN PATENT DOCUMENTS

| JP | S59-21047 A | 2/1984 |
| JP | S63-90160 A | 4/1988 |

(Continued)

*Primary Examiner* — Steven T Sawyer
(74) *Attorney, Agent, or Firm* — Oliff PLC

(57) ABSTRACT

To provide an electronic component in which the bonding position and bonding strength of a lead terminal can be maintained even if re-heated, a crystal oscillator as an electronic component includes: a first substrate having a connection terminal; and a lead terminal having a connection pad connected to the connection terminal of the first substrate via an electrically conductive bonding member. The electrically conductive bonding member has a part overlapping with the connection terminal and the connection pad, and a part arranged on the outside of the connection pad, as viewed in a plan view. The connection pad is provided with a first area overlapping with the connection terminal and a second area extending from the first area. The second area is connected to the first substrate via an insulative bonding member.

12 Claims, 12 Drawing Sheets

(51) Int. Cl.
*B81C 1/00* (2006.01)
*H01L 23/498* (2006.01)
*H01L 23/15* (2006.01)

(58) Field of Classification Search
CPC .............. H01L 23/13; H01L 23/49811; B81C 1/00261
USPC .......................... 361/774, 773; 257/786, 773
See application file for complete search history.

(56) References Cited

U.S. PATENT DOCUMENTS

| | | | |
|---|---|---|---|
| 5,270,492 A * | 12/1993 | Fukui | H01L 23/49541 174/250 |
| 2004/0155560 A1* | 8/2004 | Koike | G01C 19/5663 310/348 |
| 2011/0163569 A1* | 7/2011 | Yoneyama | H01R 12/515 296/146.1 |

FOREIGN PATENT DOCUMENTS

| | | |
|---|---|---|
| JP | H05-55438 A | 3/1993 |
| JP | H07-297533 A | 11/1995 |
| JP | H09-219485 A | 8/1997 |
| JP | 2010-199678 A | 9/2010 |

\* cited by examiner

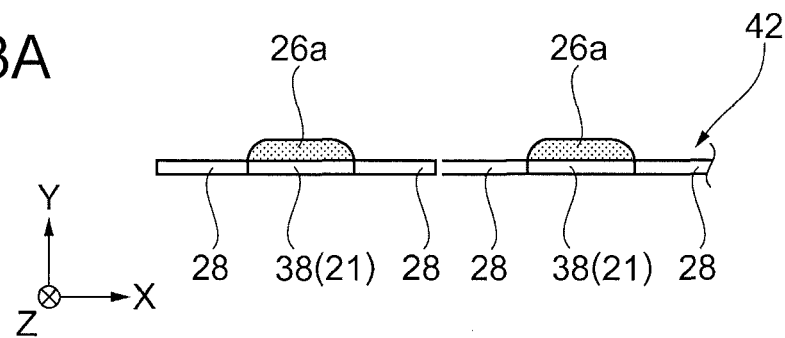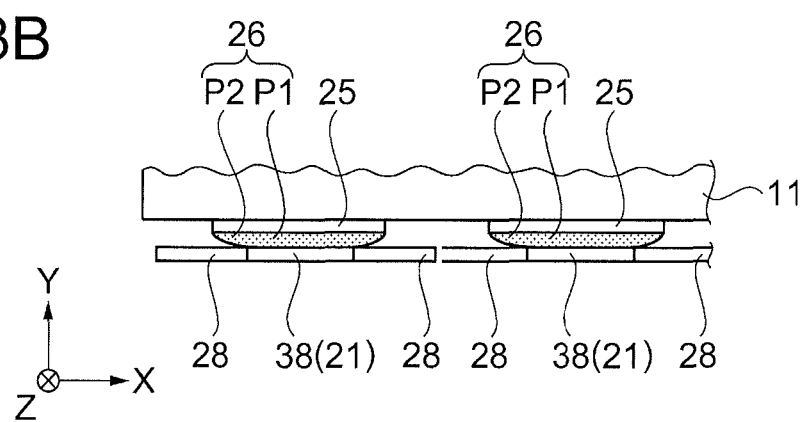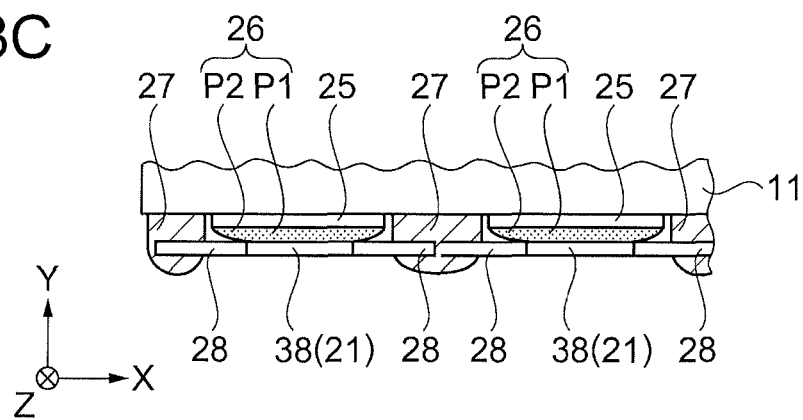

ELECTRONIC COMPONENT, METHOD FOR MANUFACTURING ELECTRONIC COMPONENT, ELECTRONIC APPARATUS, AND MOVING OBJECT

BACKGROUND

1. Technical Field

The present invention relates to an electronic component, a method for manufacturing an electronic component, an electronic apparatus, and a moving object.

2. Related Art

According to the related art, in order to mount electronic components forming an electronic apparatus onto a circuit board, a method in which an external connection terminal (lead terminal) is connected to a connection terminal on a circuit board, using an electrically conductive bonding member such as solder, for example, is known. Recently, with reduction in the size and thickness of electronic apparatuses, the configuration of electronic components and the methods for mounting electronic components on wiring boards become more complicated and there are some cases where electronic components already mounted on a circuit board are subjected to heat. If electronic components already mounted on a circuit board with an electrically conductive bonding member are subjected to heat in this manner, phenomena such as cracking due to expansion of air bubbles or the like contained in the electrically conductive bonding member or re-melting of the electrically conductive bonding member may occur, causing a risk that bonding failure such as an electrical continuity fault between the external connection terminal and the connection terminal may take place.

To cope with such failure, a configuration in which a small hole or cut is provided at the bonding site of a lead terminal is disclosed (see, for example, JP-A-5-55438). With this configuration, even if a lead terminal and a connection terminal bonded together via solder are re-heated in a reflow oven or the like, air bubbles contained in the solder can easily be released through the small hole or cut, and cracking and explosive boiling due to re-melting can be restrained. Therefore, bonding failure such as an electrical continuity fault between the external connection terminal and the connection terminal can be reduced.

However, with the configuration disclosed in JP-A-5-55438, if electronic components are re-heated in a reflow oven or the like, the solder re-melts, lowering the bonding strength between the external connection terminal (lead terminal) and the connection terminal). Therefore, there is a risk that the bonding positions of the external connection terminal (lead terminal) and the connection terminal may become misaligned. If the bonding positions of the external connection terminal (lead terminal) and the connection terminal are misaligned in this manner, there is a risk of an electrical continuity fault, short circuit or the like.

SUMMARY

An advantage of some aspects of the invention is to solve at least a part of the problems described above, and the invention can be implemented as the following forms or application examples.

APPLICATION EXAMPLE 1

An electronic component according to this application example includes: a substrate having a connection terminal; a connection pad connected to the connection terminal via an electrically conductive bonding member; and a lead terminal having a lead part extending from the connection pad. The electrically conductive bonding member has a part overlapping with the connection terminal and the connection pad, and a part arranged on the outside of the connection pad, as viewed in a plan view. The connection pad is provided with a first area overlapping with the connection terminal, and a second area connected to the first area and arranged along a different direction from a direction in which the lead part extends, as viewed in a plan view. The second area is connected to the substrate via an insulative bonding member.

In this application example, the connection terminal and the connection pad are connected together via the electrically conductive bonding member having the part overlapping with the connection terminal and the connection pad and the part arranged on the outside of the connection pad, as viewed in a plan view. Since the electrically conductive bonding member has the part arranged on the outside of the connection pad in this manner, air bubbles generated by re-heating, and a stress due to the expansion of the air bubbles can easily be released from the outside part of the connection pad, which is not obstructed by the connection pad. Therefore, the possibility of cracking of the electrically conductive bonding member and the possibility of explosive boiling of the electrically conductive bonding member can be reduced.

Also, since the connection pad is connected to the substrate in the second area view the insulative bonding member, even if the electrically conductive bonding member re-melts due to re-heating, the connection is maintained by this insulative bonding member. Thus, the weakening of the connection strength between the connection pad and the substrate, that is, the connection strength between the connection pad and the connection terminal, can be reduced, and the misalignment of the bonding positions of the connection pad and the connection terminal can be reduced. Therefore, the occurrence of an electrical continuity fault, short circuit or the like between the connection pad and the connection terminal can be reduced.

According to this application example, the possibility of cracking of the electrically conductive bonding member and the possibility of explosive boiling of the electrically conductive bonding member can be reduced. Also, the weakening of the connection strength between the connection pad and the connection terminal can be reduced and the misalignment of the bonding positions of the connection pad and the connection terminal can be reduced. In other words, an electronic component with improved reliability of bonding between the connection pad and the connection terminal can be provided.

APPLICATION EXAMPLE 2

In the electronic component according to the application example described above, it is preferable that the second area is extended to the outside of the connection terminal, as viewed in a plan view.

According to this application example, since the connection via the insulative bonding member in the second area is carried out in a broad area on the connection terminal and the substrate, the connection strength of the connection pad can be increased further and more secure connection can be achieved.

APPLICATION EXAMPLE 3

In the electronic component according to the application example described above, it is preferable that the second area is provided in a plural number.

According to this application example, since the connection area via the insulative bonding member in the second area can be made broader, the connection strength of the connection pad can be increased further and more secure connection can be achieved.

APPLICATION EXAMPLE 4

In the electronic component according to the application example described above, it is preferable that the lead terminal is provided in a plural number and that the respective second areas provided for the lead terminals situated next to each other are juxtaposed with a gap, as viewed in a plan view.

According to this application example, the respective second areas of the lead terminals situated next to each other can be arranged in a narrow area without contacting each other. The bonding strength of the connection pad can be increased and the miniaturization of the electronic component can be dealt with.

APPLICATION EXAMPLE 5

In the electronic component according to the application example described above, it is preferable that the first area has a penetration part that penetrates in a direction of viewing a plan view.

According to this application example, air bubbles generated by re-heating and a stress due to the expansion of the air bubbles can be released from the penetration part provided in the first area. Therefore, the possibility of cracking of the electrically conductive bonding member and the possibility of explosive boiling of the electrically conductive bonding member can be reduced. Also, since the bonding area is expanded by the penetration part, the bonding strength between the connection pad and the connection terminal can be increased.

APPLICATION EXAMPLE 6

A method for manufacturing an electronic component according to this application example is a method for manufacturing an electronic component including a connection terminal provided on a substrate and a connection pad from which a lead part extends and which is provided with a first area overlapping with the connection terminal and a second area connected to the first area and arranged along a different direction from a direction in which the lead part extends, as viewed in a plan view. The method includes: connecting the connection terminal and the first area to each other via an electrically conductive bonding member; and connecting the substrate and the second area to each other via an insulative bonding member.

According to this application example, since the method includes connecting the connection terminal and the first area of the connection pad to each other via the electrically conductive bonding member, and connecting the substrate and the second area of the connection pad to each other via the insulative bonding member, the connection is maintained by the insulative bonding member even if the electrically conductive bonding member re-melts due to re-heating. Thus, a manufacturing method which can reduce the weakening of the connection strength between the connection pad and the substrate, that is, the connection strength between the connection pad and the connection terminal, and which can reduce the misalignment of the bonding positions of the connection pad and the connection terminal, can be provided.

APPLICATION EXAMPLE 7

It is preferable that the method for manufacturing the electronic component according to the application example described above includes arranging the electrically conductive bonding member in the first area of the connection pad, before connecting the connection terminal and the first area to each other via the electrically conductive bonding member.

According to this application example, the method includes arranging the electrically conductive bonding member in the first area, which is the part of the connection pad overlapping with the connection terminal, before connecting the substrate and the second area to each other via the insulative bonding member. Therefore, the electrically conductive bonding member is arranged on the connection pad, which is a small-area site. Thus, the connection pad is connected to the connection terminal via the electrically conductive bonding member in the first area overlapping with the connection terminal, as viewed in a plan view, and the electrically conductive bonding member bulging out on the outside of the connection terminal can be formed easily. Therefore, air bubbles generated by re-heating, and a stress due to the expansion of the air bubbles can be easily released from the electrically conductive bonding member bulging out on the outside of the connection terminal. Thus, the possibility of cracking of the electrically conductive bonding member and the possibility of explosive boiling of the electrically conductive bonding member can be reduced.

APPLICATION EXAMPLE 8

An electronic apparatus according to this application example includes the electronic component according to any of the application examples described above.

According to this application example, the electronic component in which the possibility of weakening of the bonding strength between the connection pad and the connection terminal due to the cracking or explosive boiling of the electrically conductive bonding member caused by re-heating is reduced, thus improving the reliability of the bonding between the connection pad and the connection terminal, is used. Therefore, an electronic apparatus with more stable characteristics can be provided.

APPLICATION EXAMPLE 9

A moving object according to this application example includes the electronic component according to any of the application examples described above.

According to this application example, the electronic component in which the possibility of weakening of the bonding strength between the connection pad and the connection terminal due to the cracking or explosive boiling of the electrically conductive bonding member caused by re-heating is reduced, thus improving the reliability of the bonding between the connection pad and the connection terminal, is used. Therefore, a moving object with more stable characteristics can be provided.

BRIEF DESCRIPTION OF THE DRAWINGS

The invention will be described with reference to the accompanying drawings, wherein like numbers reference like elements.

FIG. 1A is a front cross-sectional view. FIG. 1B is a side view, as viewed in direction Q2.

FIG. 2A is a bottom view, as viewed in direction Q1 in FIG. 1A. FIG. 2B is a front view of FIG. 2A.

FIGS. 3A to 3C are front cross-sectional views showing a process flow relating to the connection of the lead terminal, in the manufacturing process of the oscillator according to the first embodiment.

FIG. 4A is a front cross-sectional view. FIG. 4B is a side view, as viewed in direction Q2.

FIG. 5A is a front cross-sectional view. FIG. 5B is a side view, as viewed in direction Q2.

FIG. 6A is a front cross-sectional view. FIG. 6B is a side view, as viewed in direction Q2.

FIG. 7A is a plan view (bottom view), as viewed in the same direction as Q1 in FIG. 1A. FIG. 7B is a front view of FIG. 7A.

FIG. 9A is a plan view (bottom view), as viewed in the same direction as FIG. 7A. FIG. 9B is a front view of FIG. 9A.

FIG. 10A is a perspective view showing the configuration of a mobile (or notebook) personal computer. FIG. 10B is a perspective view showing the configuration of a mobile phone (including PHS).

DESCRIPTION OF EXEMPLARY EMBODIMENTS

Figure 1A:
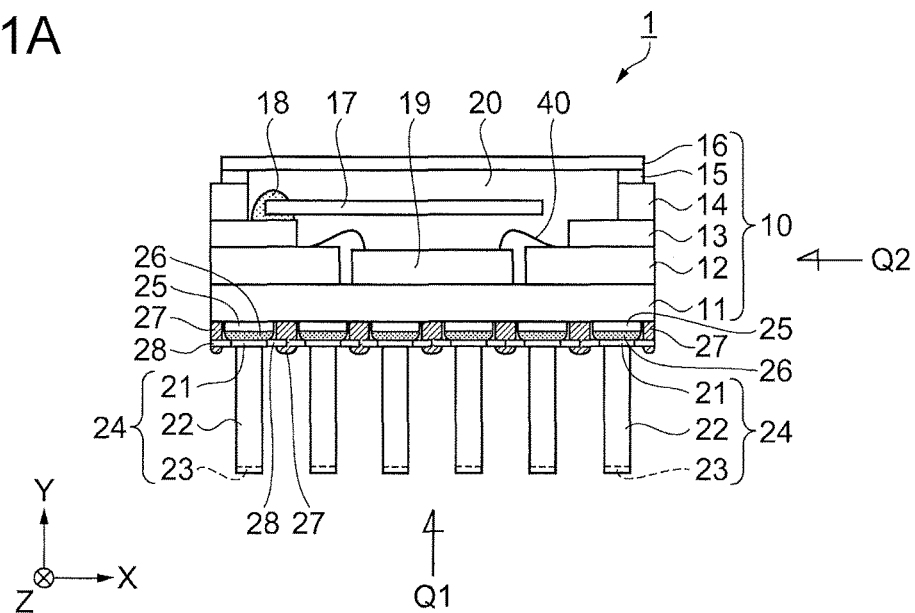
FIGS. 1A and 1B show the schematic configuration of an oscillator according to a first embodiment of an electronic component according to the invention.
Figure 1B:
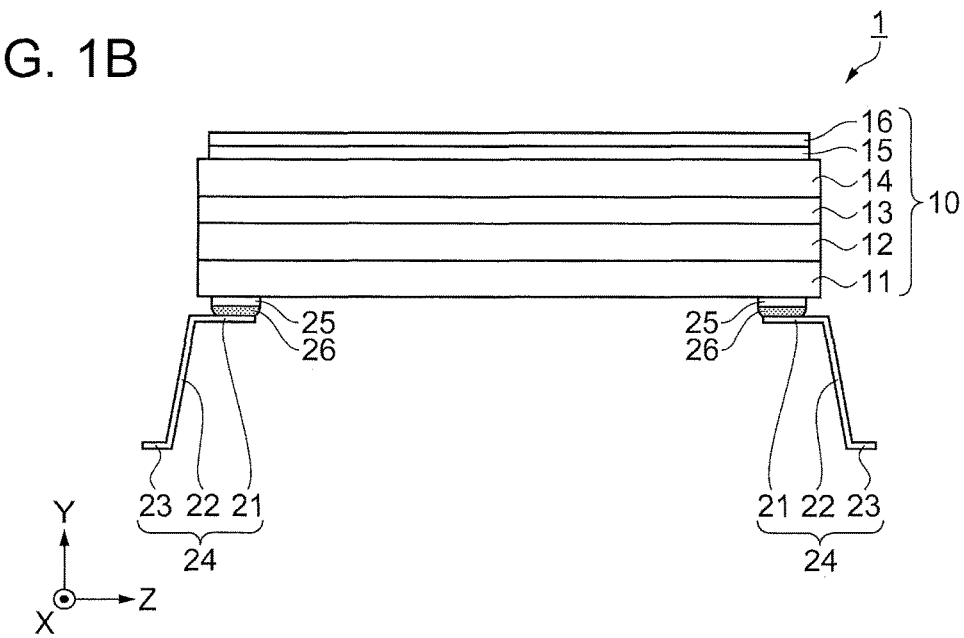
Figure 2A:
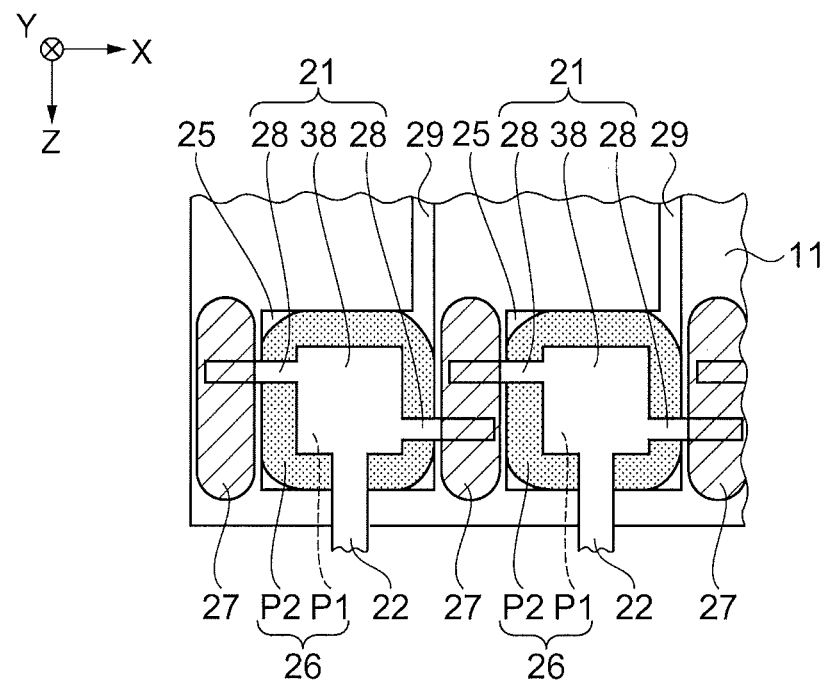
FIGS. 2A and 2B show the schematic configuration of the connection site of the lead terminal of the oscillator according to the first embodiment.
Figure 2B:
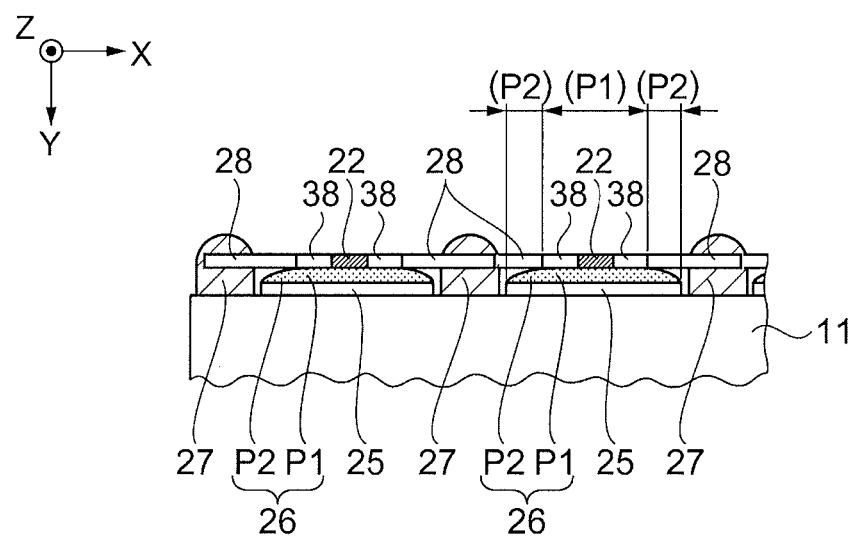

Hereinafter, embodiments of the invention will be described in detail referring to the drawings.
Electronic Component
First Embodiment
Configuration As an example of an oscillator according to a first embodiment of an electronic component according to the invention, a crystal oscillator having an SC-cut crystal oscillating piece with excellent frequency stability is employed and explained with reference to FIGS. 1A to 2B. FIGS. 1A and 1B are schematic views showing the structure of the oscillator according to the first embodiment of the electronic component according to the invention. FIG. 1A is a front cross-sectional view. FIG. 1B is a side view, as viewed in the direction of Q2 shown in FIG. 1A. FIGS. 2A and 2B show the schematic configuration of the connection site of the lead terminal of the oscillator according to the first embodiment. FIG. 2A is a bottom view, as viewed in the direction of Q1 shown in FIG. 1A. FIG. 2B is a front view of FIG. 2A. In the drawings including the drawings described below, X-axis, Y-axis and Z-axis are illustrated as three axes orthogonal to each other, as a matter of convenience for explanation. Moreover, as a matter of convenience for explanation, the surface in the direction of +Y-axis is referred to as a top surface, and the surface in the direction of −Y-axis is referred to as a bottom surface, in a plan view as viewed in the Y-axis direction. Illustration of the wiring patterns and electrode pads formed inside a container 10 including a first substrate 11 is omitted.

As shown in FIGS. 1A and 1B, a crystal oscillator 1 includes a container 10 having an integrated circuit 19 including an oscillation circuit and a crystal oscillating piece 17 accommodated in an internal space 20, and a lead terminal 24 connected to a connection terminal 25 provided on the bottom surface (surface opposite to the side of the internal space 20) of a first substrate 11 forming the container 10. The first substrate 11 forming the container 10 is equivalent to the substrate described in the appended claims.

Inside the container 10, the integrated circuit 19 and the crystal oscillating piece 17 are accommodated. The inside of the container 10 is airtightly sealed with a reduced-pressure atmosphere having a vacuum or a lower pressure than atmospheric pressure, or an inert gas atmosphere such as nitrogen, argon, or helium.

The container 10 is formed including the first substrate 11, a second substrate 12, a third substrate 13 and a fourth substrate 14 stacked on each other, and a lid member 16 connected to the fourth substrate 14 via a sealing member 15. The second substrate 12, the third substrate 13 and the fourth substrate 14 are ring-shaped bodies with center parts thereof removed. The sealing member 15 such as a seal ring or low-melting glass is formed on the peripheral edge of the top surface of the fourth substrate 14. As a material forming the first substrate 11, the second substrate 12, the third substrate 13 and the fourth substrate 14, ceramics or the like can be used suitably. Also, glass, resin, metal or the like, other than ceramics, may be used as materials forming the first substrate 11, the second substrate 12, the third substrate 13 and the fourth substrate 14.

A recessed part (cavity) for accommodating the integrated circuit 19 is formed by the second substrate 12 and the third substrate 13. A recessed part (cavity) for accommodating the crystal oscillating piece 17 is formed by the third substrate 13 and the fourth substrate 14.

The integrated circuit 19 is bonded via a bonding member (not shown) to the top surface of the first substrate 11 in the part where the center part of the second substrate 12 is removed. The integrated circuit 19 is electrically connected to an electrode pad (not shown) arranged on the top surface of the second substrate 12 via a bonding wire 40. The crystal oscillating piece 17 is bonded at a predetermined position on the top surface of the third substrate 13 via a bonding member 18 such as an electrically conductive adhesive. The crystal oscillating piece 17 other than the part connected via the bonding member 18 is held spaced apart from the other sites in the internal space 20.

On the bottom surface of the first substrate 11, which is the bottom surface of the container 10, the connection terminal 25 having electrical continuity via a wire (not shown) to, for example, the crystal oscillating piece 17 and the integrated circuit 19 or the like, is provided. The connection terminal 25 in this embodiment is provided on both end sides in the Z-axis direction (direction of width) on the bottom surface of the first substrate 11, and on each side, six connection terminals are arrayed at a predetermined space along the X-axis direction, that is, a total of twelve connection terminals are arranged. It should be noted that the number of the connection terminals 25, which is twelve in this embodiment, is not limited and may be any number. The connection terminals 25 are formed by screen-printing and burning a metal wiring material such as tungsten (W) or molybdenum (Mo) on a substrate that forms the connection terminals 25 and then plating the material with nickel (Ni), gold (Au) or the like. The connection terminals 25 in this embodiment are in a substantially rectangular flat shape with a wiring pattern 29 extending from the vicinity of one corner, as shown in FIG. 2A.

As shown in FIGS. 1A and 1B, the lead terminal 24 connected to the connection terminal 25 has a connection pad 21 connecting to the connection terminal 25, a lead part 22 extending from the connection pad 21, and a lead end part 23 that is a site extending from the lead part and connected to a mounting board or the like, not shown. The lead part 22 extending in a direction along the Z-axis from the connection pad 21 bends downward (in the −Y-axis direction) near the edge of the container 10 and extends in this manner. The end part of the lead part 22 opposite to the side of the connection pad 21 is provided with the lead end part 23 bent in a direction along the Z-axis.

As a material forming the lead terminal 24, a plate member with high electrical conductivity and relatively high formability such as 42 alloy (iron-nickel alloy) or copper alloy is suitable, and surface treatment such as nickel plating is performed thereon for use.

A part of the connection pad 21 is connected with electrical continuity to the connection terminal 25 via an electrically conductive bonding member 26 such as solder, for example, and another part of the connection pad 21 is connected to the first substrate 11 via an insulative bonding member 27. The arrangement of each part will be described in detail below.

As shown in FIGS. 2A and 2B, the connection pad 21 is provided with a substantially rectangular first area 38 overlapping with the connection terminal 25, and a second area 28 extending from the first area 38, as viewed in a plan view. From the first area 38 of the connection pad 21, the lead part 22 with a smaller width than the first area 38 extends in the Z-axis direction. Moreover, from the first area 38 of the connection pad 21, a plurality of second areas 28 extends in the way of protruding in the −X-axis direction and +X-axis direction, which are directions along the X-axis and intersecting with the direction (Z-axis direction) in which the lead part 22 extends. The width in the X-axis direction of the lead part 22 may be the same as the width in the X-axis direction of the first area 38 or greater than the width in the X-axis direction of the first area 38.

Each of the second areas 28 extends to a position overlapping with the outside of the connection terminal 25, as viewed in a plan view. Since the second areas 28 thus extend to the positions overlapping with the outside of the connection terminals 25, the connection range of the second areas 28 in the insulative bonding member 27, described later, can be broadened and the connection strength can be increased further. Also, since the second areas 28 extend from the single first area 38, the connection range of the second areas 28 in the insulative bonding member 27 can be similarly broadened and the connection strength can be increased further. As the insulative bonding member 27, for example, a thermosetting or ultraviolet-curing resin, glass or the like can be used.

The second areas 28 extending from the connection pads 21 arranged next to each other, toward the respective connection pads 21 situated next, are juxtaposed with a gap. That is, the second areas 28 next to each other are spaced apart from each other. Since the second areas 28 are thus arranged coaxially with a gap, the second areas 28 of the respective connection pads 21 situated next to each other can be arranged in a narrow area with contacting each other and therefore the arrangement area can be reduced. Also, the application of the insulative bonding member 27 can be carried out in the same area and the efficiency of the application work can be enhanced.

As shown in FIGS. 2A and 2B, the electrically conductive bonding member 26 includes a part P1 overlapping with the connection terminal 25 and the connection pad 21 (a part of the first area 38 and the second area 28), and a part P2 arranged on the connection terminal 25 on the outside of the connection pad 21 (a part of the first area 38 and the second area 28), as viewed in a plan view. The outside of the connection pad 21 (a part of the first area 38 and the second area 28) can be paraphrased as a part where the electrically conductive bonding member 26 does not overlap with the connection pad 21 (a part of the first area 38 and the second area 28), as viewed in a plan view.

As described above, the connection pad 21 is connected, at a part of the first area 38 and the second area 28, with electrical continuity to the connection terminal 25 via the electrically conductive bonding member 26 such as solder, for example, and is connected to the first substrate 11 via the insulative bonding member 27 on the distal end side of the second area 28.

According to the crystal oscillator 1 having such bonding between the connection pad 21 and the connection terminal 25, since the electrically conductive bonding member 26 has the part P2 which is arranged on the outside of the connection pad 21 (a part of the first area 38 and the second area 28), air bubbles generated when the electrically conductive bonding member 26 is re-heated, and a stress due to the expansion of the air bubbles can be easily released from the part P2 where the surface of the electrically conductive bonding member 26 is open to the outside environment. Therefore, the possibility of cracking of the electrically conductive bonding member 26 and the possibility of weakening of the bonding strength between the connection pad 21 and the connection terminal 25 due to the explosive boiling of the electrically conductive bonding member 26 can be reduced.

Also, since the connection pad 21 is connected to the first substrate 11 via the insulative bonding member 27 in the second area 28, the insulative bonding member 27 does not melt even if the re-heated electrically conductive bonding member 26 re-melts. Therefore, the connection of the connection pad 21 is maintained by the insulative bonding member 27 even if the electrically conductive bonding member 26 re-melts. Thus, the weakening of the connection strength between the connection pad 21 and the connection terminal 25 on the first substrate 11 can be prevented and the misalignment of the bonding positions of the connection pad 21 and the connection terminal 25 can be reduced. Therefore, the occurrence of failure such as an electrical continuity fault or short circuit between the connection pad 21 and the connection terminal 25 can be reduced. While the configuration in which the connection pad 21 has a plurality of second areas 28 is described in this example, this configuration is not limiting and similar effects can be achieved if the connection pad 21 has at least one second area.

Manufacturing Method

Next, an outline of a method for manufacturing a crystal oscillator as an example of the oscillator according to the first embodiment of the electronic component according to the invention will be described, referring to FIGS. 3A to 3C. FIGS. 3A to 3C are front cross-sectional views showing a process flow relating to the connection of the lead terminal, in the process of manufacturing the crystal oscillator according to the first embodiment. In the description below, the process relating to the connection of the lead terminal 24 in the process of manufacturing the crystal oscillator 1 will be mainly described. The same configurations as in the crystal oscillator 1 are denoted by the same reference numbers.

First Process

First, a first process in which the lead terminal 24 (see FIGS. 1A and 1B) is prepared and then an electrically conductive bonding member 26a is arranged will be described.

In the first process, as shown in FIG. 3A, the lead terminal 24 (see FIGS. 1A and 1B), having the connection pad 21 and the lead part 22 extending from the connection pad 21 (see FIGS. 1A and 1B), is prepared. A plurality of the lead terminals 24 is juxtaposed and the juxtaposed lead terminals 24 are supplied in lead frames (not shown) connected via a connection lead (not shown). The connection pad 21 has a first area 38 which overlaps with the connection terminal 25 (see FIGS. 2A and 2B) and two second areas 28 extending on both sides in a direction (X-axis direction) intersecting with the direction (Z-axis direction) in which the lead part 22 extends, as viewed in a plan view (Y-axis direction).

The electrically conductive bonding member 26a in the form of paste is provided (applied) to the first area 38 of the prepared connection pad 21. As the electrically conductive bonding member 26a in the form of paste, for example, a solder paste formed by adding a flux to solder powder to achieve proper viscosity, or the like, is used. For the provision (application) of the electrically conductive bonding member 26a, for example, a printing method using a metal mask, or for example, an ejection method using a dispenser or the like can be used. In this way, in the first process, the electrically conductive bonding member 26a is arranged in the first area 38, which is a small-area site.

Second Process

Next, a second process in which the connection terminal 25 and the first area 38 of the connection pad 21 are connected together via the electrically conductive bonding member 26a will be described. The container 10 (see FIGS. 1A and 1B) including the first substrate 11, described later, is similar to the configuration where the integrated circuit 19 including an oscillation circuit and the crystal oscillating piece 17 are accommodated in the internal space 20, and therefore will not be described further.

In the second process, as shown in FIG. 3B, the first substrate 11 having the connection terminal 25 (container 10, not shown) is connected to the connection pad 21 via the electrically conductive bonding member 26a in the form of paste provided (applied) to the first area 38. The first substrate 11 is arranged in such a way that the connection terminal 25 overlaps with the first area 38 of the connection pad 21, as viewed in a plan view (Y-axis direction), and is placed via the electrically conductive bonding member 26a. Then, the electrically conductive bonding member 26a in the form of paste is heated to the melting temperature thereof. Thus, the bonding material of the electrically conductive bonding member 26a in the form of paste is melted and the solvent such as the flux is eliminated. The electrically conductive bonding member 26 is formed of the melted bonding material (for example, solder).

The electrically conductive bonding member 26 is formed, including a part P1 and a part P2. The melted bonding material (electrically conductive bonding member 26a) flows out from the part P1 overlapping with the connection terminal 25 and the connection pad 21 (a part of the first area 38 and the second areas 28), as viewed in a plan view (Y-axis direction), and the part P2 on the outside of the connection pad 21 (a part of the first area 38 and the second areas 28) is formed. Via this electrically conductive bonding member 26, the connection terminal 25 and the connection pad 21 are connected together with electrical continuity.

Third Process

Next, a third process in which the second areas 28 of the connection pad 21 are connected to the first substrate 11 via the insulative bonding member 27 will be described.

In the third process, as shown in FIG. 3C, the insulative bonding member 27 is supplied at least between the second areas 28 of the connection pad 21 and the first substrate 11 overlapping with the second areas 28 as viewed in a plan view (Y-axis direction). Subsequently, the insulative bonding member 27 is hardened by hardening such as heating, thus connecting the second areas 28 of the connection pad 21 and the first substrate 11 to each other. As the insulative bonding member 27, for example, a thermosetting resin having an electrical insulation property such as epoxy resin or polyimide resin is used. As the thermosetting resin, a thermosetting resin with a lower curing temperature than the melting point of the electrically conductive bonding member 26 is preferable.

The insulative bonding member 27 may be laid over the second area 28 overlapping with the first substrate 11 as viewed in a plan view (Y-axis direction) and the second area 28 of the connection pad 21, or may be laid over the connection terminal 25, which is an insulative member, or over the electrically conductive bonding member 26.

Lead Terminal Shaping Process

Subsequently, the lead terminal 24 (see FIGS. 1A and 1B) connected to the first substrate 11 (connection terminal 25) shifts to a lead terminal shaping process, though not shown.

In the lead terminal shaping process, the connection lead of the lead terminal 24 connected to the first substrate 11 (connection terminal 25) is removed. Thus, the lead terminal 24 (see FIGS. 1A and 1B) becomes independent and is detached from the lead frame. Moreover, the lead terminal 24 is folded in a mountain fold near the end of the first substrate 11 extending from the connection pad 21 and is folded in a valley fold near the distal end part. The crystal oscillator 1 as an electronic component can thus be formed.

According to the above manufacturing method, in the arrangement of the electrically conductive bonding member 26a in the first process, the electrically conductive bonding member 26 is arranged in the first area 38, which is a small-area site. Therefore, the connection pad 21 is connected to the connection terminal 25 via the electrically conductive bonding member 26 in the part P1 overlapping with the connection terminal 25, as viewed in a plan view, and the electrically conductive bonding member 26 in the part P2 bulging out on the outside of the connection terminal 25 can be easily formed.

Second Embodiment

As an example of an oscillator according to a second embodiment of the electronic component according to the invention, a crystal oscillator having an SC-cut crystal oscillating piece is employed and described with reference to FIGS. 4A and 4B.

Figure 4A:
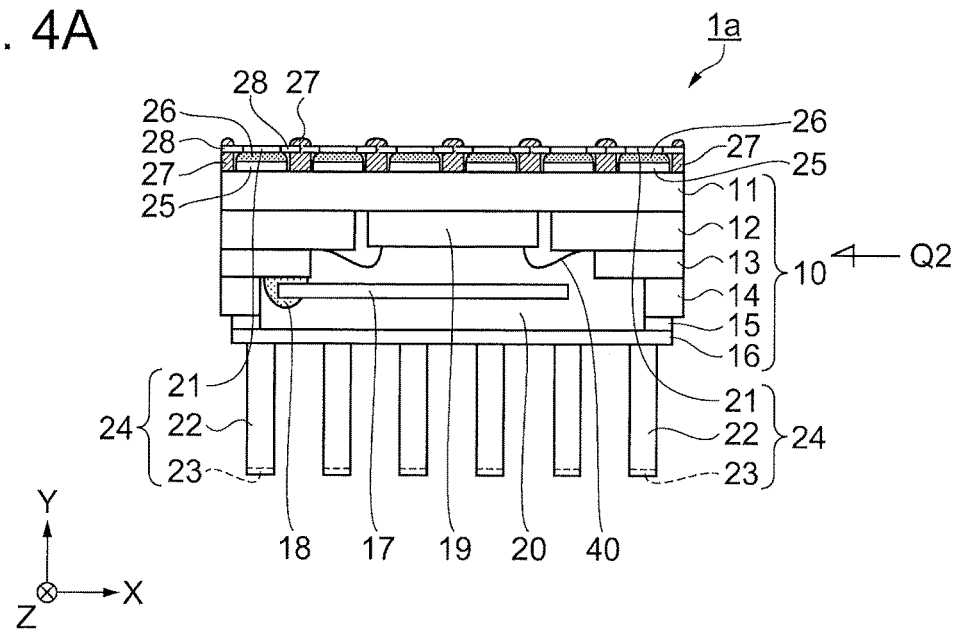
FIGS. 4A and 4B show the schematic configuration of an oscillator according to a second embodiment of the electronic component according to the invention.
Figure 4B:
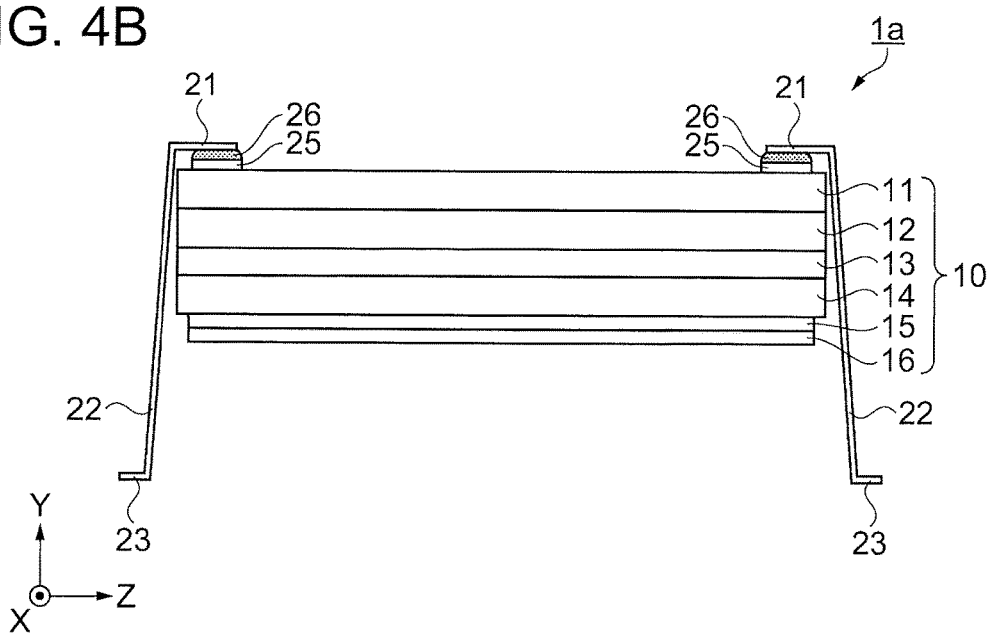

FIGS. 4A and 4B are schematic views showing the structure of the oscillator according to the second embodiment of the electronic component according to the invention. FIG. 4A is a front cross-sectional view. FIG. 4B is a side view, as viewed in the direction of Q2 shown in FIG. 4A. The X-axis, Y-axis and Z-axis, and the top and bottom surface in the description are similar to those in the first embodiment.

The second embodiment has a configuration in which the direction of the container 10 with respect to the lead terminal 24 is different (vertically inverted) from that in the crystal oscillator 1 of the first embodiment. In this description, the different configuration from the first embodiment is mainly described and similar configurations to those of the first embodiment may be denoted by the same reference numbers without further description. Illustration of the wiring patterns and electrode pads formed inside the container 10 is omitted.

As shown in FIGS. 4A and 4B, a crystal oscillator 1a of the second embodiment includes a container 10 having an integrated circuit 19 including an oscillation circuit and a crystal oscillating piece 17 accommodated in an internal space 20, and a lead terminal 24 connected to a connection terminal 25 provided on the top surface (surface opposite to the side of the internal space 20) of a first substrate 11 as a substrate forming the container 10.

In the crystal oscillator 1a of this embodiment, the container 10 is arranged in such a way that the direction of Y-axis (up and down direction) of the container 10 described in the first embodiment is reversed, that is, the first substrate 11 provided with the connection terminal 25 is on the top side in the direction of Y-axis, while the lid member 16 is on the bottom side in the direction of Y-axis. On the tope side of the container 10 (in the +Y-axis direction), a first area 38 (see FIGS. 2A and 2B) and a second area 28 forming a connection pad 21, and the connection terminal 25 are connected together via an electrically conductive bonding member 26 and an insulative bonding member 27. This connection is similar to that in the first embodiment and therefore will not be described further.

Again, in the crystal oscillator 1a using such a bonding method for the connection pad 21, air bubbles generated when the electrically conductive bonding member 26 is re-heated, and a stress due to the expansion of the air bubbles can be easily released from a part P2 where the surface is opened, as in the crystal oscillator 1 of the first embodiment. Thus, the possibility of cracking of the electrically conductive bonding member 26 and the possibility of weakening of the bonding strength between the connection pad 21 and the connection terminal 25 due to the explosive boiling of the electrically conductive bonding member 26 can be reduced.

Even if re-heating is carried out, the connection between the connection pad 21 and the first substrate 11 is maintained by the insulative bonding member 27 and the possibility of weakening of the connection strength between the connection pad 21 and the connection terminal 25 on the first substrate 11 can be reduced.

Third Embodiment

As an example of an oscillator according to a third embodiment of the electronic component according to the invention, a crystal oscillator having an SC-cut crystal oscillating piece is employed and described with reference to FIGS. 5A and 5B.

Figure 5A:
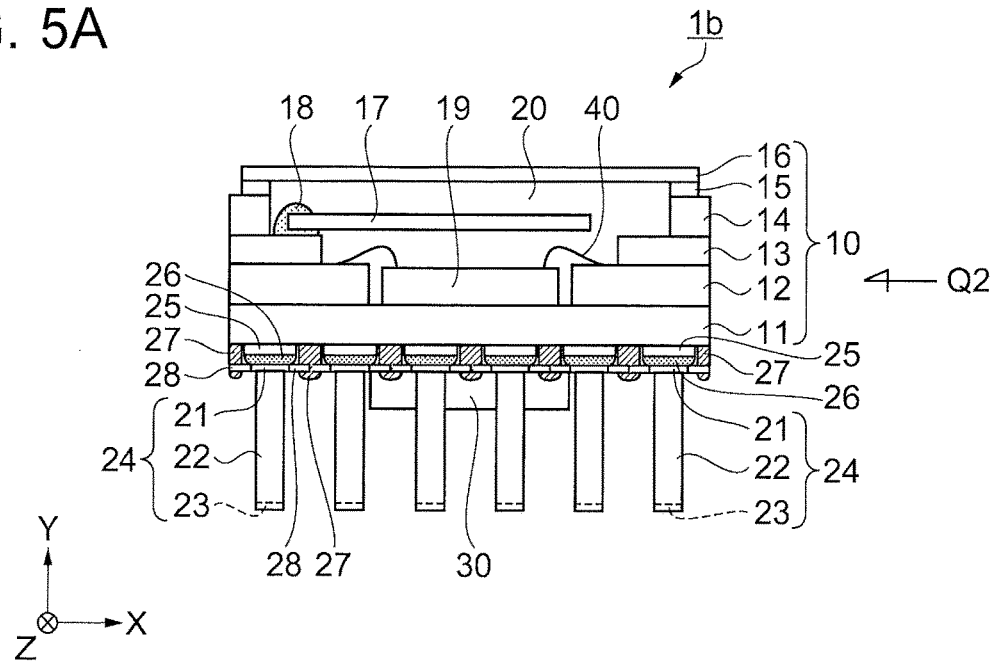
FIGS. 5A and 5B show the schematic configuration of an oscillator according to a third embodiment of the electronic component according to the invention.
Figure 5B:
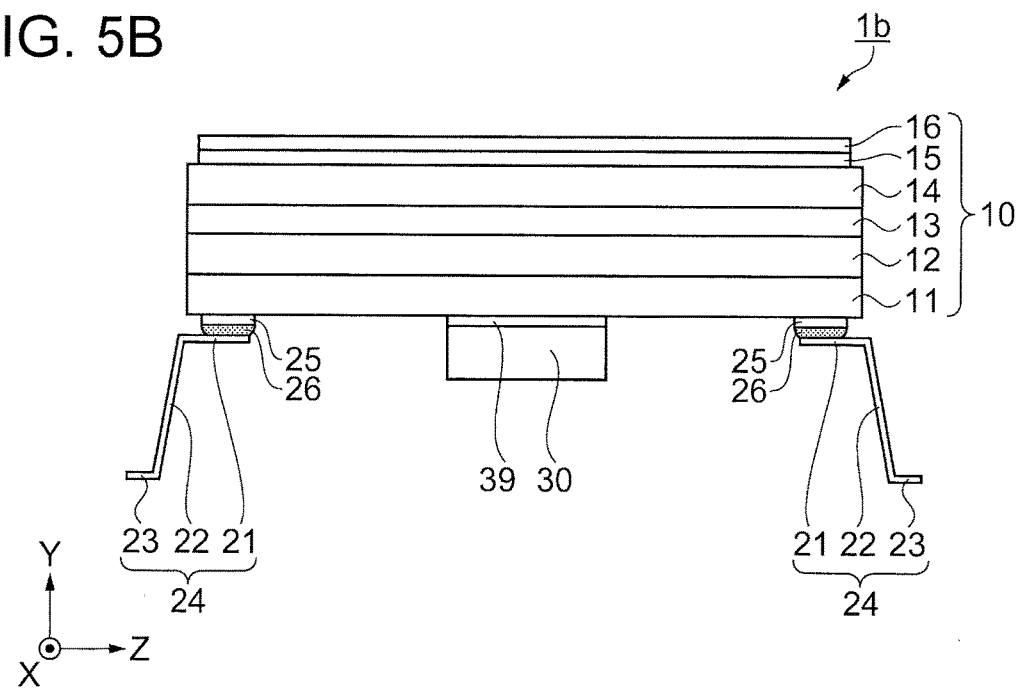

FIGS. 5A and 5B are schematic views showing the structure of the oscillator according to the third embodiment of the electronic component according to the invention. FIG. 5A is a front cross-sectional view. FIG. 5B is a side view, as viewed in the direction of Q2 shown in FIG. 5A. In the description of the third embodiment, similar configurations to those of the first embodiment are denoted by the same reference numbers and will not be described further in detail.

As shown in FIGS. 5A and 5B, a crystal oscillator 1b of the third embodiment has a configuration in which a circuit element 30 and circuit components (not shown) are connected to the bottom surface (surface where the connection terminal 25 is provided) of the container 10 of the crystal oscillator 1 of the first embodiment. The other configurations are similar to those of the first embodiment and therefore will not be described further.

The circuit element 30 and the circuit components (not shown) are connected, with electrical connection, to a land electrode 39 arranged between connection terminals 25 arrayed in two lines on the bottom surface of the container 10. The land electrode 39 is electrically connected to a crystal oscillating piece 17 or an integrated circuit 19 or the like via a wiring electrode, not shown. The circuit element 30 and the circuit components (not shown) adjust, for example, an oscillation circuit or the like included in the crystal oscillating piece 17 or the integrated circuit 19.

According to the crystal oscillator 1b of the third embodiment, the circuit element 30 and the circuit components are arranged outside the container 10 but on the inside side of two lines of lead terminals 24 connected to the container 10. Thus, even if an external force such as an impact is applied to the crystal oscillator 1b, the circuit element 30 and the circuit components are protected by the stress relaxation effect of the lead terminals 24. Therefore, failure such as damage to the crystal oscillator 1b as an electronic component can be prevented and the reliability thereof can be increased.

Fourth Embodiment

As an example of an oscillator according to a fourth embodiment of the electronic component according to the invention, an oven-controlled crystal oscillator (OCXO) having an SC-cut crystal oscillating piece with excellent frequency stability is employed and described with reference to FIGS. 6A and 6B.

Figure 6A:
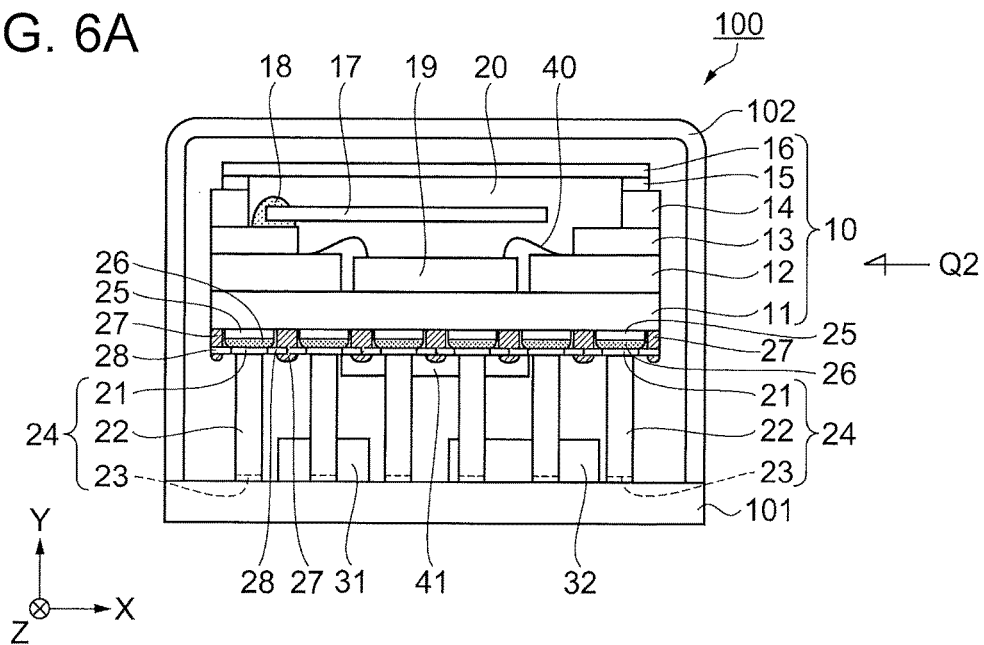
FIGS. 6A and 6B show the schematic configuration of an oscillator according to a fourth embodiment of the electronic component according to the invention.
Figure 6B:
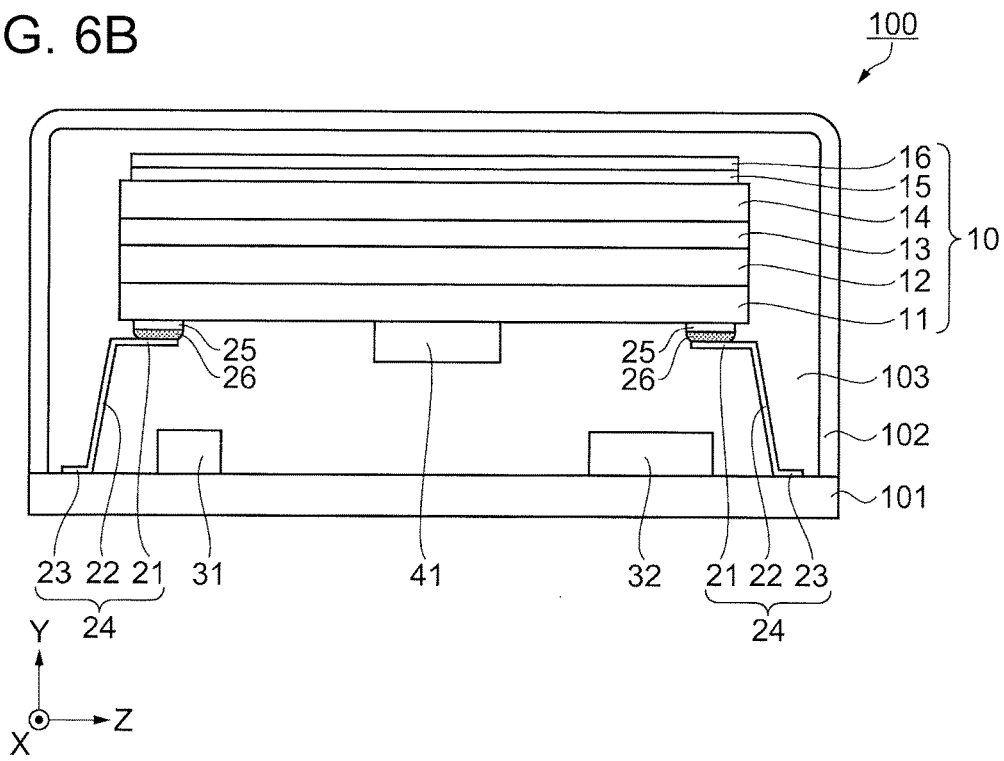

FIGS. 6A and 6B are schematic views showing the structure of the oscillator according to the fourth embodiment of the electronic component according to the invention. FIG. 6A is a front cross-sectional view. FIG. 6B is a side view, as viewed in the direction of Q2 shown in FIG. 6A. In FIG. 6B, the state where a cover 102 is cut is illustrated as a matter of convenience in explaining the configuration of a crystal oscillator 100. Also, in the description, the X-axis, Y-axis, Z-axis, and top and bottom surface are used similarly to the first embodiment. Moreover, illustration of the wiring patterns and electrode pads formed on the top surface of a base substrate 101, a connection electrode formed on the outer surface of a container 10, and the wiring patterns and electrode pads formed inside the container 10 is omitted.

The crystal oscillator 100 as an electronic component uses an SC-cut crystal oscillating piece having excellent frequency stability due to low external stress sensitivity. As shown in FIGS. 6A and 6B, the crystal oscillator 100 includes a container 10 having an integrated circuit 19 including an oscillation circuit and a crystal oscillating piece 17 accommodated in an internal space 20, a lead terminal 24 connected to a connection terminal 25 provided on the bottom surface of the container 10, a heat generating member 41 connected to the bottom surface of the container 10, and circuit components 31, 32 arranged on the top surface of the base substrate 101. Also, on the top surface of the base substrate 101 of the crystal oscillator 100, the container 10 is arranged in a separate state from the base substrate 101 via the lead terminal 24, and the circuit components 31, 32 such as a plurality of capacitors, resistors or the like are arranged. Moreover, the container 10 and the circuit components 31, 32 and the like are covered with a cover 102 and accommodated in an inner section 103 of the cover 102. The inner section 103 of the cover 102 may be airtightly sealed with a reduced-pressure atmosphere having a vacuum or a lower pressure than atmospheric pressure, or an inert gas atmosphere such as nitrogen, argon, or helium. Alternatively, the inner section 103 may not be airtightly sealed.

The bottom surface of the container 10 is one surface of the first substrate 11 as a substrate forming the container 10 and opposite to the side of the internal space 20 of the container 10.

As a material forming the cover 102, a nickel-plated iron-based alloy with low thermal conductivity such as 42 alloy (iron-nickel alloy) is suitable.

The configuration of the container 10 including the crystal oscillating piece 17 accommodated in the container 10 is similar to that in the first embodiment and therefore will not be described further. Also, the configuration of the lead terminal 24 connected to the connection terminal 25 on the container 10 is similar to that in the first embodiment and therefore will not be described further.

The heat generating member 41 connected to the bottom surface of the container 10 is made up of a power transistor, a resistance heat generating member or the like. The heat generating member 41 controls the temperature of the container 10 and reduces variance in resonance frequency due to temperature change in the crystal oscillating piece 17. The heat generating member 41 can also be arranged inside the internal space 20 of the container 10. If the heat generating member 41 is thus arranged inside the internal space 20, temperature control of the crystal oscillating piece 17 can be carried out more efficiently.

The base substrate 101 is made of an insulative material such as glass epoxy resin or ceramic. A wire (not shown) provided on the base substrate 101 is formed by a method such as etching from a substrate with a copper foil applied on the entire surface, or screen-printing and burning a metal wiring material such as tungsten (W) or molybdenum (Mo) on a substrate and then plating the material with nickel (Ni), gold (Au) or the like.

The lead terminal 24 having a connection pad 21 connected to the connection terminal 25 on the container 10 is connected to the wire (not shown) provided on the base substrate 101 by a soldering method or the like, at the portion of a lead end part 23 via a lead part 22. In the case of the OCXO (oven-controlled crystal oscillator) performing temperature control of the crystal oscillating piece 17 as in this embodiment, the use of an iron-based alloy with low thermal conductivity such as 42 alloy (iron-nickel alloy) is suitable for a constituting material of the lead terminal 24 because it is hard for the heat inside the container 10 to be released outside via the lead terminal 24.

According to the crystal oscillator 100 of the fourth embodiment, it is possible to provide an OCXO (oven-controlled crystal oscillator) in which the connection stability of the connection part between the connection terminal 25 and the connection pad 21 can be maintained even in re-heating, for example, at the time of mounting the crystal oscillator 100 on the circuit board of an electronic apparatus, and in which the temperature of the crystal oscillating piece 17 is controlled by the heat generating member 41, thus reducing variance in resonance frequency due to temperature change in the crystal oscillating piece 17.

In addition, even if an external force such as an impact is applied to the crystal oscillator 100, the heat generating member 41 and the circuit components 31, 32 are protected by the stress relaxation effect of the lead terminals 24. Therefore, the possibility of failure such as damage to the crystal oscillator 100 as an electronic component can be reduced and the oscillator can be improved in reliability.

In the embodiment, the bending shape of the lead terminal 24 is described as a so-called gullwing lead type in which the lead end part 23 is bent outward. However, this example is not limiting and a so-called J-lead type in which the lead end part 23 is bent inward may also be employed.

As an example of the crystal oscillating piece 17 illustrated in the embodiment, a rectangular SC-cut crystal oscillating piece is used. However, this example is not limiting. A circular SC-cut crystal oscillating piece or a rectangular or circular AT-cut crystal oscillating piece may be used. Also, a tuning fork-type crystal oscillating piece, an elastic surface wave resonating piece, a piezoelectric oscillator, or a MEMS (micro electro-mechanical systems) resonating piece may be used. As a substrate material of the oscillating piece, a piezoelectric single crystal such as lithium tantalate or lithium niobate, a piezoelectric material such as piezoelectric ceramic like lead zirconate titanate, or a silicon semiconductor material may be used, other than crystal. As a measure for exciting the oscillating piece, excitation based on a piezoelectric effect, or electrostatic driving based on a Coulomb force may be used.

In the embodiments, the crystal oscillators 1, 1a, 1b, 100 using the crystal oscillating piece 17 are described as examples of the electronic component according to the invention. However, these examples are not limiting. For example, the invention can also be applied to an electronic component having another function such as a sensor including a sensor element for acceleration, angular velocity or the like.

Modifications of Connection Pad

Figure 7A:
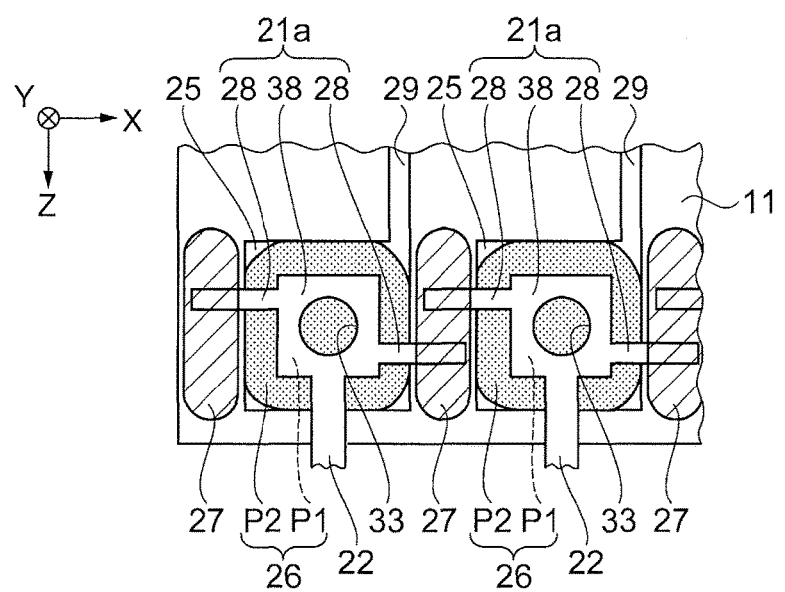
FIGS. 7A and 7B show Modification 1 of the connection pad.
Figure 7B:
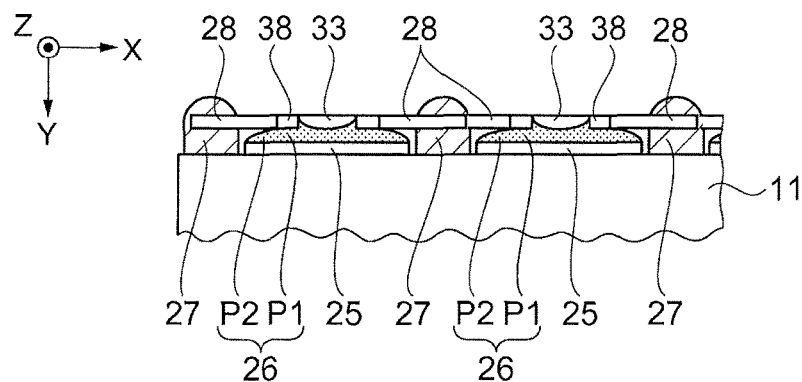
Figure 8:
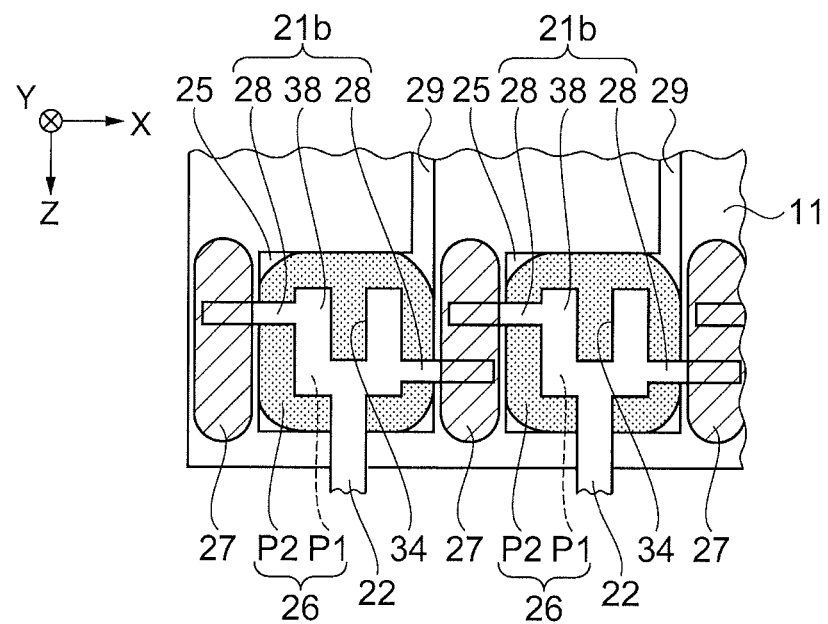
FIG. 8 is a plan view (bottom view) showing Modification 2 of the connection pad, as viewed in the same direction as FIG. 7A.
Figure 9A:
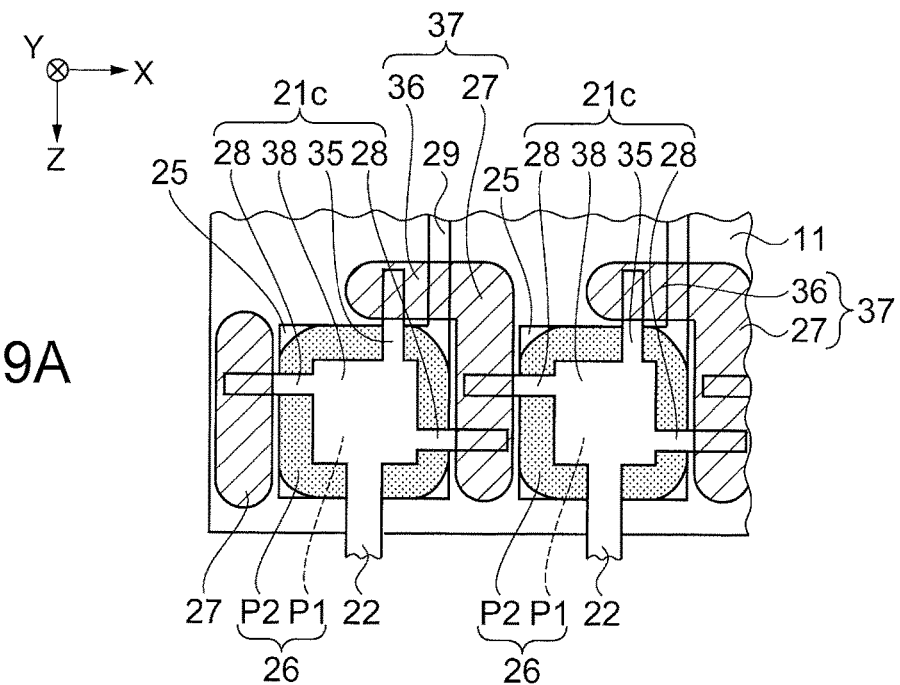
FIGS. 9A and 9B show Modification 3 of the connection pad.
Figure 9B:
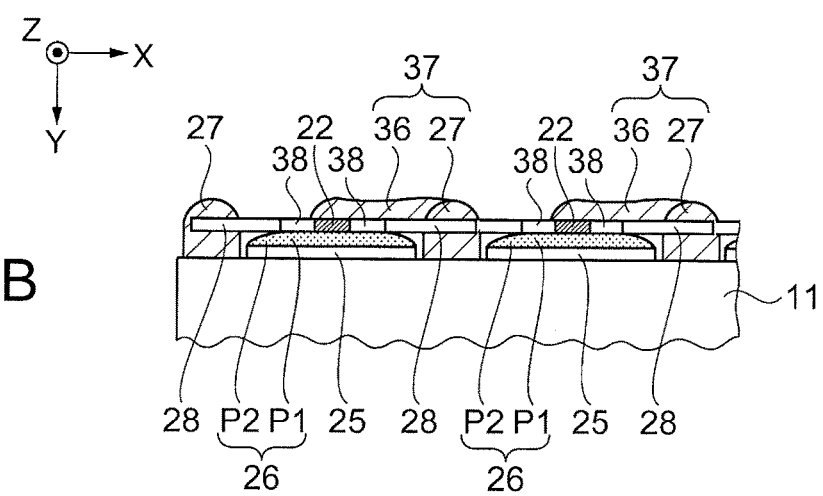

Next, modifications of the connection pad will be described referring to FIGS. 7A and 7B, FIG. 8, and FIGS. 9A and 9B. FIGS. 7A and 7B show Modification 1 of the connection pad. FIG. 7A is a plan view (bottom view), as viewed in the same direction as Q1 in FIG. 1A. FIG. 7B is a front view of FIG. 7A. FIG. 8 is a plan view (bottom view) showing Modification 2 of the connection pad, as viewed in the same direction as FIG. 7A. FIGS. 9A and 9B show Modification 3. FIG. 9A is a plan view (bottom view), as viewed in the same direction as FIG. 7A. FIG. 9B is a front view of FIG. 9A. In the description below, similar configurations to those in the embodiments are denoted by the same reference numbers and will not be described further.

Modification 1

Referring to FIGS. 7A and 7B, Modification 1 of the connection pad will be described. A connection pad 21a shown in FIGS. 7A and 7B has a configuration in which a through-hole 33 as a penetration part is provided in the first area 38 of the configuration of the connection pad 21 described in the first embodiment. The other sites thereof are similar to the connection pad 21 of the first embodiment and therefore may be denoted by the same reference numbers with the description thereof omitted or simplified.

The connection pad 21*a* in Modification 1 is situated near one end of the lead terminal 24 and connected to the connection terminal 25. The connection pad 21*a* has a first area 38 and a second area 28, as in the first embodiment. In the connection pad 21*a*, the through-hole 33 as a penetration part penetrating the connection pad from the front side to the back side in the direction of viewing a plan view (the direction of thickness of the connection pad 21*a*) is provided at a center part of the first area 38, as viewed in a plan view.

Since the through-hole 33 is provided in the first area 38 as in Modification 1, air bubbles generated in the electrically conductive bonding member 26 due to re-heating, and a stress due to the expansion of the air bubbles can be easily released without being obstructed by the first area 38. Therefore, the possibility of cracking of the electrically conductive bonding member 26 and the possibility of weakening of the bonding strength between the connection pad 21*a* and the connection terminal 25 due to the explosive boiling of the electrically conductive bonding member 26 can be reduced. Also, since the electrically conductive bonding member 26 creeps up to the part of the through-hole 33 as well, the bonding area can be broadened and the bonding strength between the connection pad 21*a* and the connection terminal 25 can be increased.

Modification 2

Referring to FIG. 8, Modification 2 of the connection pad will be described. A connection pad 21*b* shown in FIG. 8 has a configuration in which a cut-out part 34 as a penetration part is provided in the first area 38 of the configuration of the connection pad 21 described in the first embodiment. The other sites thereof are similar to the connection pad 21 of the first embodiment and therefore may be denoted by the same reference numbers with the description thereof omitted or simplified.

The connection pad 21*b* in Modification 2 is situated near one end of the lead terminal 24 and connected to the connection terminal 25. The connection pad 21*b* has a first area 38 and a second area 28, as in the first embodiment. The connection pad 21*b* has the first area 38 and two second areas 28 extending on both sides in a direction (X-axis direction) intersecting with the direction (+Z-axis direction) in which the lead part 22 extends, as viewed in a plan view.

Moreover, the connection pad 21*b* is provided with the cut-out part 34 extending from the end in the −Z-axis direction of the first area 38 toward the inner side (+Z-axis direction) of the first area 38, as viewed in a plan view. The cut-out part 34 as a penetration part penetrates the connection pad from the front side to the back side in the direction of viewing a plan view (Y-axis direction, which is the direction of thickness of the connection pad 21*b*). Also, the cut-out part 34 is provided having an opening where the end side of the first area 38 where the second area 28 and the lead part 22 are not provided, that is, the open end of the first area 38, is opened in the −Z-axis direction.

Since the cut-out part 34 is provided in the first area 38 as in Modification 2, air bubbles generated in the electrically conductive bonding member 26 due to re-heating, and a stress due to the expansion of the air bubbles can be easily released without being obstructed by the first area 38. Therefore, the possibility of cracking of the electrically conductive bonding member 26 and the possibility of weakening of the bonding strength between the connection pad 21*b* and the connection terminal 25 due to the explosive boiling of the electrically conductive bonding member 26 can be reduced. Also, since the electrically conductive bonding member 26 creeps up to the part of the cut-out part 34 as well, the bonding area can be broadened and the bonding strength between the connection pad 21*b* and the connection terminal 25 can be increased.

Modification 3

Referring to FIGS. 9A and 9B, Modification 3 of the connection pad will be described. A connection pad 21*c* shown in FIGS. 9A and 9B is different from the first embodiment in the configuration of the second area 28 in the connection pad 21. The other sites thereof are similar to the connection pad 21 of the first embodiment and therefore may be denoted by the same reference numbers with the description thereof omitted or simplified.

The connection pad 21*c* in Modification 3 is situated near one end of the lead terminal 24 and connected to the connection terminal 25. The connection pad 21*c* has a first area 38 and a second area 28, as in the first embodiment. From the first area 38 of the connection pad 21*c*, a lead part 22 extending in the +Z-axis direction, and three second areas 28 and second area 35 extending on both sides in a direction (X-axis direction) intersecting with the direction (Z-axis direction) in which the lead part 22 extends and extending in the −Z-axis direction, are provided.

The first area 38 is connected to the connection terminal 25 via an electrically conductive bonding member 26 including a part P1 where the first area 38 and the connection terminal 25 overlap with each other and a part P2 where the first area 38 and the connection terminal 25 do not overlap with each other.

The second area 28 extending in the −X-axis direction is connected to the first substrate 11 via an insulative bonding member 27. The second area 28 extending in the +X-axis direction and the second area 35 extending in the −Z-axis direction are connected to the first substrate 11 via an insulative bonding member 37 made up of the insulative bonding member 27 and an insulative bonding member 36.

Since the second areas 28 and the second area 35 extend in three directions and connected via the insulative bonding member 27 and the insulative bonding member 37 as in Modification 3, the connection pad 21*c* is fixed (held) in the three directions and the bonding strength between the connection pad 21*c* and the first substrate 11 can be increased further.

Electronic Apparatus

Next, an electronic apparatus to which at least one of the crystal oscillators 1, 1*a*, 1*b*, 100 according to the embodiments of the electronic component according to the invention is applied will be described referring to FIGS. 10A, 10B and 11. In the description below, the case of using the crystal oscillator 1 is described as an example.

Figure 10A:
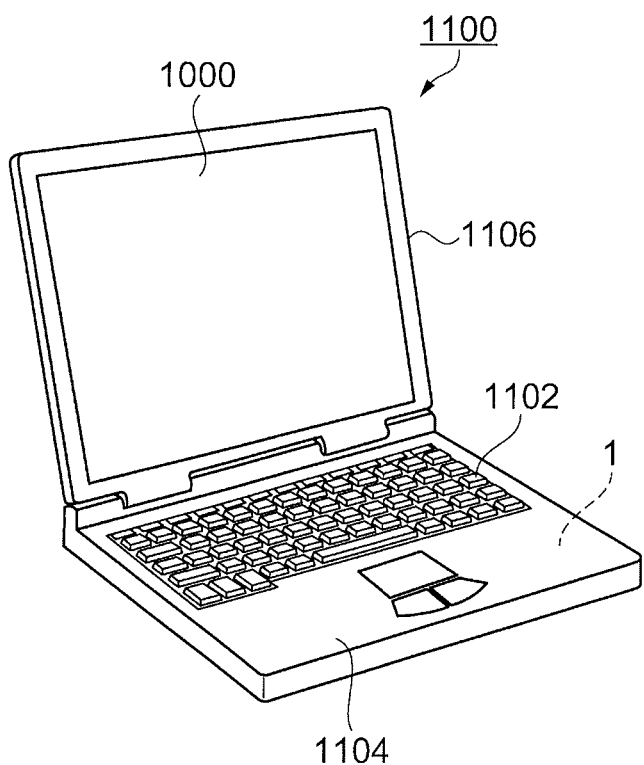
FIGS. 10A and 10B are schematic views of an electronic apparatus having the electronic component according to the invention.
Figure 10B:
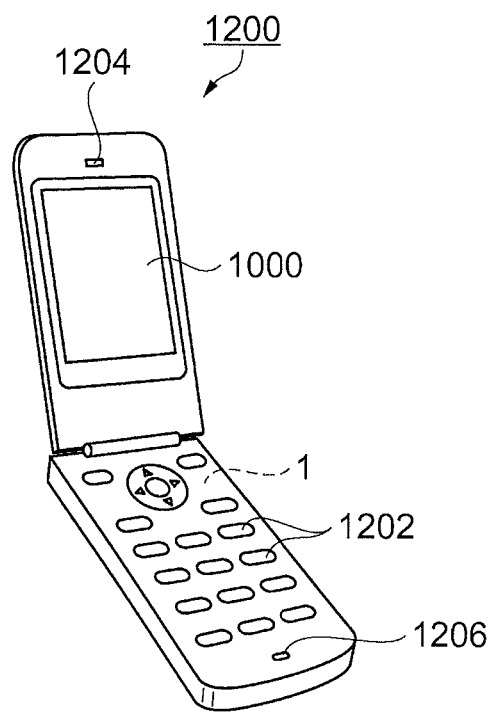

FIGS. 10A and 10B are schematic views showing an electronic apparatus having the crystal oscillator 1 according to the one embodiment of the invention. FIG. 10A is a perspective view showing the configuration of a mobile (or notebook) personal computer 1100. FIG. 10B is a perspective view showing the configuration of a mobile phone 1200 (including a PHS).

In FIG. 10A, the personal computer 1100 is made up of a main body unit 1104 having a keyboard 1102, and a display unit 1106 having a display section 1000. The display unit 1106 is supported so as to be able to turn via a hinge structure with respect to the main body unit 1104. In this personal computer 1100, the crystal oscillator 1 having high frequency stability is arranged as a built-in component.

In FIG. 10B, the mobile phone 1200 has a plurality of operation buttons 1202, an earpiece 1204, and a mouthpiece 1206. The display section 1000 is arranged between the operation buttons 1202 and the earpiece 1204. In this mobile phone 1200, the crystal oscillator 1 having high frequency stability is arranged as a built-in component.

Figure 11:
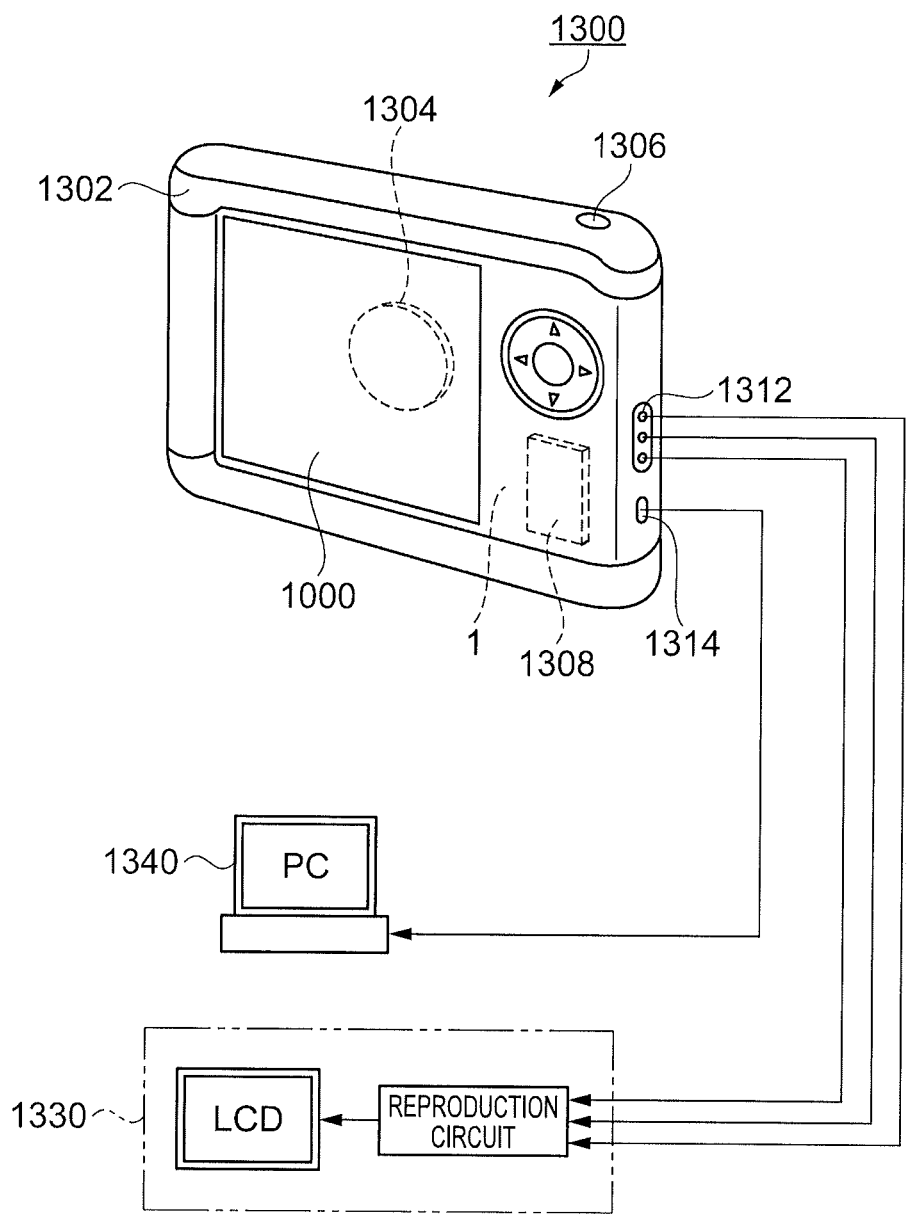
FIG. 11 is a perspective view showing the configuration of a digital camera as an electronic apparatus having the electronic component according to the invention.

FIG. 11 is a perspective view showing the configuration of a digital camera 1300 as an electronic apparatus having the crystal oscillator 1 according to the one embodiment of the invention. In FIG. 11, the connection to external devices is shown in a simplified manner.

In the digital camera 1300, an optical image of a subject is photoelectrically converted by an image pickup element such as a CCD (charge coupled device), thus generating a pickup image signal (image signal).

On the back side of a case (body) 1302 of the digital camera 1300, a display section 1000 is provided, configured to perform display based on the pickup image signal generated by the CCD. The display section 1000 functions as a viewfinder which shows a subject as an electronic image. On the front side of the case 1302 (back side in the illustration), a light receiving unit 1304 including an optical lens (image pickup optical system), a CCD or the like is provided.

As a photographer confirms the subject image displayed in the display section 1000 and presses a shutter button 1306, the pickup image signal by the CCD at the time point is transferred to and stored in a memory 1308. Also, in this digital camera 1300, a video signal output terminal 1312 and a data communication input/output terminal 1314 are provided on a lateral side of the case 1302. As illustrated, a television monitor 1330 is connected to the video signal output terminal 1312 and a personal computer 1340 is connected to the data communication input/output terminal 1314, according to need. Moreover, the digital camera is configured to output the pickup image signal stored in the memory 1308 to the television monitor 1330 and the personal computer 1340 in response to a predetermined operation. In this digital camera 1300, the crystal oscillator 1 having high frequency stability is arranged as a built-in component.

As described above, by utilizing the crystal oscillators 1, 1a, 1b, 100 having high frequency stability for an electronic apparatus, it is possible to provide an electronic apparatus with higher performance. Also, as at least one of the crystal oscillators 1, 1a, 1b, 100 according to the invention is applied to an electronic apparatus, the possibility of cracking of the bonding member which bonds the connection pad and the connection terminal in the crystal oscillator 1, 1a, 1b, 100 and the possibility of weakening of the bonding strength between the connection pad and the connection terminal in the crystal oscillator 1, 1a, 1b, 100 can be reduced, for example, even if the crystal oscillator 1, 1a, 1b, 100 according to the invention is re-heated at the time of assembling the electronic apparatus. Therefore, an electronic apparatus with high reliability can be provided.

The crystal oscillators 1, 1a, 1b, 100 according to the embodiments of the invention can also be applied to electronic apparatuses, for example, an inkjet ejection device (for example, ink jet printer), laptop personal computer, tablet personal computer, television, video camera, video recorder, car navigation system, real-time clock device, pager, electronic notebook (including one with communication functions), electronic dictionary, electronic calculator, electronic game machine, workstation, TV phone, surveillance television monitor, electronic binoculars, POS terminal, medical equipment (for example, electronic thermometer, blood pressure gauge, blood glucose meter, electrocardiograph, ultrasonic diagnosis device, electronic endoscope), fishfinder, various measuring devices, instruments (for example, instruments on a vehicle, aircraft and ship), flight simulator, mobile communication base station equipment, storage area network equipment such as router and switch, local area network equipment, network transmission equipment, head-mounted display, motion tracer, motion tracker, motion controller, PDR (pedestrian dead reckoning), other than the personal computer 1100 of FIG. 10A (mobile personal computer), the mobile phone 1200 of FIG. 10B, and the digital camera 1300 of FIG. 11.

Moving Object

Next, a moving object to which at least one of the crystal oscillators 1, 1a, 1b, 100 according to the embodiments of the electronic component according to the invention will be described, referring to FIG. 12. In the description below, the case of using the crystal oscillator 1 will be described as an example.

Figure 12:
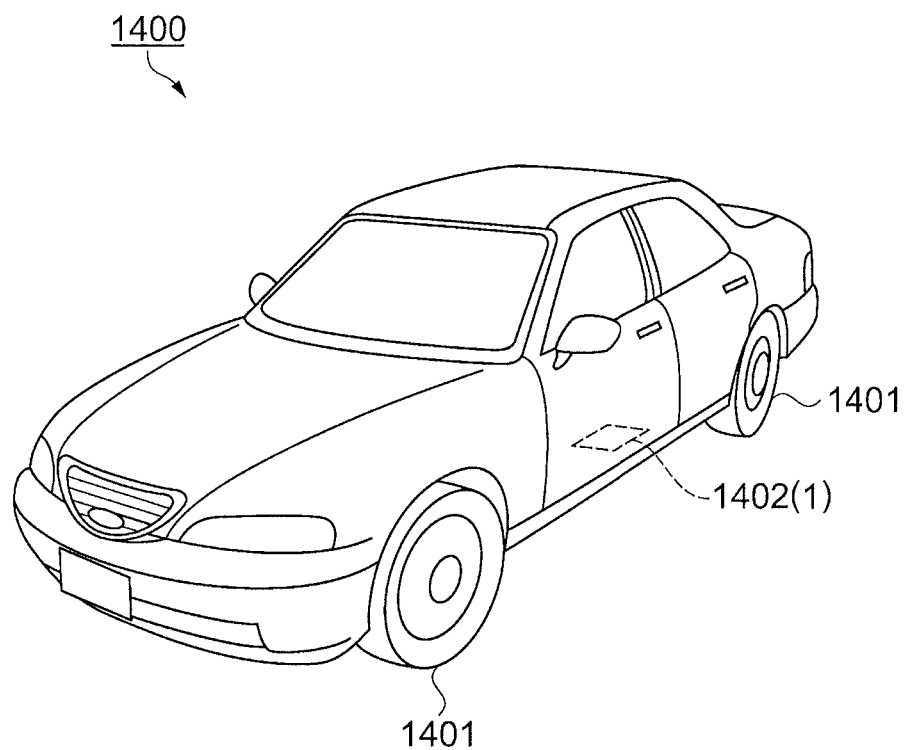
FIG. 12 is a perspective view showing the configuration of an automobile as a moving object having the electronic component according to the invention.

FIG. 12 is a perspective view showing the configuration of an automobile 1400 as a moving object having the crystal oscillator 1 according to the one embodiment of the invention.

In the automobile 1400, a gyro sensor including the crystal oscillator 1 according to the invention is installed. For example, as shown in FIG. 12, an electronic control unit 1402 having this gyro sensor as a built-in component to control wheels 1401 is installed in the automobile 1400 as a moving object. As other examples, the crystal oscillator 1 can be broadly applied to the electronic control unit (ECU) of a keyless entry system, immobilizer, car navigation system, car air-conditioning system, anti-lock braking system (ABS), air bag, tire pressure monitoring system (TPMS), engine control, braking system, battery monitor of hybrid car or electric car, and vehicle posture control system.

As described above, by utilizing one of the crystal oscillators 1, 1a, 1b, 100 having high frequency stability for the automobile 1400 as a moving object, it is possible to provide a moving object with higher performance. Also, as at least one of the crystal oscillators 1, 1a, 1b, 100 according to the invention is applied to a moving object, the possibility of cracking of the bonding member which bonds the connection pad and the connection terminal in the crystal oscillator 1, 1a, 1b, 100 and the possibility of weakening of the bonding strength between the connection pad and the connection terminal in the crystal oscillator 1, 1a, 1b, 100 can be reduced, for example, even if the crystal oscillator 1, 1a, 1b, 100 according to the invention is re-heated at the time of assembling the moving object. Therefore, a moving object with high reliability can be provided.

The electronic apparatus and the moving object to which the crystal oscillator 1, 1a, 1b, 100 according to the invention is applied are described above on the basis of the illustrated embodiments. However, the invention is not limited to these embodiments and the configuration of each part can be replaced with an arbitrary configuration having similar functions. Also, another arbitrary configuration may be added to the invention. Moreover, the above embodiments may be suitably combined.

The entire disclosure of Japanese Patent Application No. 2014-150484, filed Jul. 24, 2014 is expressly incorporated by reference herein.

What is claimed is:

1. An electronic component comprising:
   a substrate including a connection terminal;
   a plurality of connection pads each connected to the connection terminal via an electrically conductive bonding member; and a lead terminal having a lead part connected to at least one of the connection pads;
wherein the electrically conductive bonding member, as viewed in a plan view, has
a part overlapping with the connection terminal and the at least one of the connection pads, and
a part arranged on the outside of the at least one of the connection pads, each connection pad, as viewed in a plan view, being provided with
a first area overlapping with the connection terminal, and
a second area connected to the first area and arranged along a different direction from a direction in which each connection pad and the lead part are arranged,
the second area is connected to the substrate via an insulative bonding member, and
the second areas extending from adjacent ones of the plurality of connection pads overlap, in a section view, along a direction in which the plurality of connection pads are arranged, and are juxtaposed with a gap along a direction perpendicular to the direction in which the plurality of connection pads are arranged.

2. The electronic component according to claim 1, wherein
the second area is arranged on the outside of the connection terminal on a distal end side in the different direction, as viewed in a plan view.

3. The electronic component according to claim 1, wherein
the second area is provided in a plural number for each connection pad.

4. The electronic component according to claim 2, wherein
the second area is provided in a plural number for each connection pad.

5. The electronic component according to claim 1, wherein
the first area has a penetration part that penetrates in a direction of viewing a plan view.

6. The electronic component according to claim 2, wherein
the first area has a penetration part that penetrates in a direction of viewing a plan view.

7. The electronic component according to claim 3, wherein
the first area has a penetration part that penetrates in a direction of viewing a plan view.

8. The electronic component according to claim 4, wherein
the first area has a penetration part that penetrates in a direction of viewing a plan view.

9. A method for manufacturing an electronic component including
a connection terminal provided on a substrate, and
a plurality of connection pads from which a lead part is connected, each connection pad provided with a first area overlapping with the connection terminal and a second area connected to the first area and arranged along a different direction from a direction in which the lead part extends, as viewed in a plan view,
the second areas extending from adjacent ones of the plurality of connection pads overlap, in a section view, along a direction in which the plurality of connection pads are arranged, and are juxtaposed with a gap along a direction perpendicular to the direction in which the plurality of connection pads are arranged,
the method comprising:
connecting the connection terminal and the first area to each other via an electrically conductive bonding member; and
connecting the substrate and the second area to each other via an insulative bonding member.

10. The method for manufacturing the electronic component according to claim 9, comprising
arranging the electrically conductive bonding member in the first area of each connection pad, before the connecting of the connection terminal and the first area to each other via the electrically conductive bonding member.

11. An electronic apparatus comprising the electronic component according to claim 1.

12. A moving object comprising the electronic component according to claim 1.

* * * * *